(12) United States Patent
Kang

(10) Patent No.: US 9,178,117 B2
(45) Date of Patent: Nov. 3, 2015

(54) LIGHT EMITTING DEVICE HAVING INTERSTITIAL ELEMENTS IN GRAIN BOUNDARIES OF BARRIER LAYER

(71) Applicant: LG INNOTEK CO., LTD., Seoul (KR)

(72) Inventor: Han Byul Kang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/057,341

(22) Filed: Oct. 18, 2013

(65) Prior Publication Data

US 2014/0110743 A1 Apr. 24, 2014

(30) Foreign Application Priority Data

Oct. 19, 2012 (KR) .......................... 10-2012-0116370

(51) Int. Cl.
  *H01L 27/15* (2006.01)
  *H01L 29/165* (2006.01)
  (Continued)

(52) U.S. Cl.
  CPC .......... *H01L 33/44* (2013.01); *H01L 21/28575* (2013.01); *H01L 33/40* (2013.01); *H01L 21/02304* (2013.01); *H01L 21/02362* (2013.01); *H01L 21/76841* (2013.01); *H01L 23/53223* (2013.01); *H01L 23/53266* (2013.01); *H01L 28/84* (2013.01); *H01L 33/32* (2013.01); *H01L 2224/4051* (2013.01); *H01L 2224/4851* (2013.01)

(58) Field of Classification Search
  CPC ............ H01L 28/84; H01L 2224/4051; H01L 2224/4851; H01L 21/28575; H01L 33/32; H01L 33/40; H01L 33/44; H01L 21/02304; H01L 21/02362; H01L 21/76841; H01L 23/53223; H01L 23/53266
  USPC ............... 257/85, 94, 99, 431, 432, 459, 751, 257/753, 767
  See application file for complete search history.

(56) References Cited

U.S. PATENT DOCUMENTS

| 4,510,514 A | 4/1985 | Camlibel et al. ................. 357/17 |
| 5,345,108 A * | 9/1994 | Kikkawa ....................... 257/751 |

(Continued)

FOREIGN PATENT DOCUMENTS

| EP | 2 101 363 A2 | 9/2009 |
| EP | 2 287 930 A1 | 2/2011 |
| JP | 61006823 A * | 1/1986 ............ H01L 21/285 |

OTHER PUBLICATIONS

Sinke, W. et al.: "Oxygen in Titanium Nitride Diffusion Barriers"; American Institute of Physics, Applied Physics Letters; vol. 47, No. 5; Sep. 1, 1985; pp. 471-473 (XP-000816299).

(Continued)

*Primary Examiner* — Teresa M Arroyo
(74) *Attorney, Agent, or Firm* — KED & Associates LLP

(57) ABSTRACT

A light emitting device includes a light emitting structure including a first conductive semiconductor layer, an active layer on the first conductive semiconductor layer, and a second conductive semiconductor layer on the active layer, and an electrode on at least one of the first conductive semiconductor layers or the second semiconductor layer. The electrode includes an adhesive layer on the light emitting structure, a barrier layer on the adhesive layer, and a bonding layer on the barrier layer. The barrier layer includes a plurality of grain boundaries, and the grain boundaries include interstitial elements.

20 Claims, 5 Drawing Sheets

(51) Int. Cl.
*H01L 31/12* (2006.01)
*H01L 33/00* (2010.01)
*H01L 27/14* (2006.01)
*H01L 31/0232* (2014.01)
*H01L 23/48* (2006.01)
*H01L 23/52* (2006.01)
*H01L 29/40* (2006.01)
*H01L 33/44* (2010.01)
*H01L 21/285* (2006.01)
*H01L 33/40* (2010.01)
*H01L 21/02* (2006.01)
*H01L 21/768* (2006.01)
*H01L 23/532* (2006.01)
*H01L 49/02* (2006.01)
*H01L 33/32* (2010.01)

(56) References Cited

U.S. PATENT DOCUMENTS

| | | | |
|---|---|---|---|
| 6,740,906 B2 * | 5/2004 | Slater et al. | 257/99 |
| 2003/0203210 A1 * | 10/2003 | Graff et al. | 428/412 |
| 2005/0194603 A1 | 9/2005 | Slater, Jr. et al. | 257/98 |
| 2006/0251800 A1 * | 11/2006 | Weidman et al. | 427/99.5 |
| 2007/0246735 A1 * | 10/2007 | Yahata et al. | 257/103 |
| 2008/0217640 A1 | 9/2008 | Suzuki et al. | 257/98 |
| 2009/0230422 A1 * | 9/2009 | Katsuno et al. | 257/99 |
| 2011/0272669 A1 | 11/2011 | Tan et al. | 257/13 |
| 2012/0049232 A1 * | 3/2012 | Okabe et al. | 257/98 |
| 2012/0168803 A1 | 7/2012 | Lee et al. | 257/98 |
| 2012/0187446 A1 * | 7/2012 | Ito et al. | 257/99 |
| 2013/0134429 A1 * | 5/2013 | Yamada | 257/66 |
| 2013/0214292 A1 * | 8/2013 | Kazama | 257/79 |

OTHER PUBLICATIONS

Leem, Dong-Seok et al.: "Improvement of the Electrical Properties of Al-based Reflective Electrode on P-type GaN for Flip-Chip Light-Emitting Diodes"; Electronic Materials Letters, vol. 1, No. 2; Jan. 2, 2005; pp. 115-119 (XP-007922490).

European Search Report dated Jan. 30, 2014 issued in Application No. 13 18 7956.

* cited by examiner

LIGHT EMITTING DEVICE HAVING INTERSTITIAL ELEMENTS IN GRAIN BOUNDARIES OF BARRIER LAYER

CROSS-REFERENCE TO RELATED APPLICATIONS

The present application claims priority under 35 U.S.C. §119(a) of Korean Patent Application No. 10-2012-0116370 filed on Oct. 19, 2012, which is hereby incorporated by reference in its entirety.

BACKGROUND

Field

Research on a lighting emitting device package with a light emitting device has been actively performed. For example, the light emitting device is a semiconductor light emitting device or a semiconductor light emitting diode which is formed by a semiconductor material to convert electrical energy into light.

Such a semiconductor light emitting device has advantages such as low power consumption, a semi-permanent life cycle, a fast response time, safety, and environment friendly requirement compared to the light source of the related art such as a fluorescent lamp and an incandescent bulb. Many studies are being in progress in order to replace the existing light sources with semiconductor light emitting devices.

Also, the semiconductor light emitting devices are being increasingly used as light sources for lighting devices, such as various lamps, liquid crystal display devices, electric signboards, and streetlamps used indoors and outdoors.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

In the description of the embodiments, it will be understood that, when a constituent element is referred to as being "on" or "under" another constituent element, it can be "directly" or "indirectly" on the other constituent element, or one or more intervening elements may also be present. In addition, the terminology of 'on (above)' and 'under (below)' may include both the meanings of 'upward' and 'downward' based on one constituent element.

Figure 1:
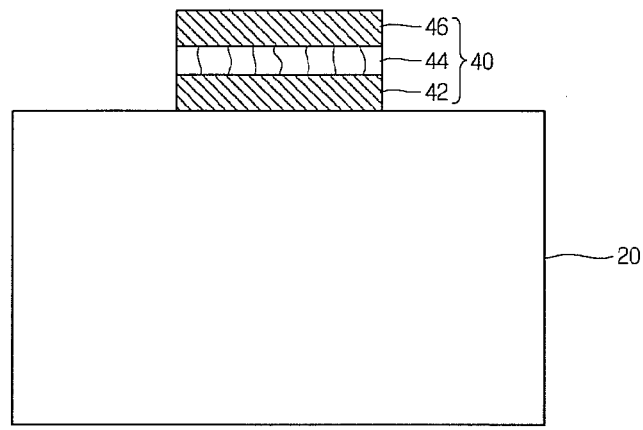
FIG. 1 is a sectional view of a light emitting device according to the embodiment.

FIG. 1 is a sectional view of a light emitting device according to the embodiment.

Referring to FIG. 1, the light emitting device according to the embodiment may include a light emitting structure 20 and an electrode 40 disposed on the light emitting structure 20.

The light emitting structure 20 may include a plurality of compound semiconductor layers. The compound semiconductor layers may include at least a first conductive semiconductor layer, an active layer, and a second conductive semiconductor layer, but the embodiment is not limited thereto. The first conductive semiconductor layer may include an N type semiconductor layer and the second conductive semiconductor layer may include a P type semiconductor layer, but the embodiment is not limited thereto.

At least one electrode 40 may be formed on the light emitting structure 20 according to a type of the light emitting device.

As will be described, the light emitting device may include one of a lateral-type light emitting device (see FIG. 8), a flip-type (see FIG. 9), and a vertical-type light emitting device (see FIG. 10).

In a case of the lateral-type light emitting device and/or the flip-type light emitting device, the electrode 40 may include a first electrode and a second electrode. For example, the first electrode may be formed on the first conductive semiconductor layer of the light emitting structure 20, and the second electrode may be formed on the second conductive semiconductor layer. In this case, the second conductive semiconductor layer and the active layer may be removed from the light emitting structure 20 so that the first conductive semiconductor layer is exposed.

Accordingly, power is applied to the first and second electrodes so that light is emitted from the active layer of the light emitting structure 20.

A transparent conductive layer or a reflective layer is formed on the second conductive semiconductor layer of the light emitting structure 20 so that the light emitting device may be classified into the lateral-type light emitting device and the flip-type light emitting device.

That is, in the lateral-type light emitting device, a transparent conductive layer is formed on the second conductive semiconductor layer so that light generated from the active layer may be output to the outside through the transparent conductive layer. In the flip-type light emitting device, a reflective layer is formed on the second conductive semiconductor layer so that light generated from the active layer may be reflected by the reflective layer so that the reflected light output to the outside through the substrate.

In a case of the vertical-type light emitting device, the electrode 40 may be formed on only the first conductive semiconductor layer. In this case, a reflective layer serving as an electrode may be formed below the second conductive semiconductor layer of the light emitting structure 20.

Accordingly, if power is applied to the reflective layer and the electrode 40, the light may be generated from the active layer of the light emitting structure 20, be reflected by the reflective layer, and be output to the outside through the first conductive semiconductor layer.

Figure 2:
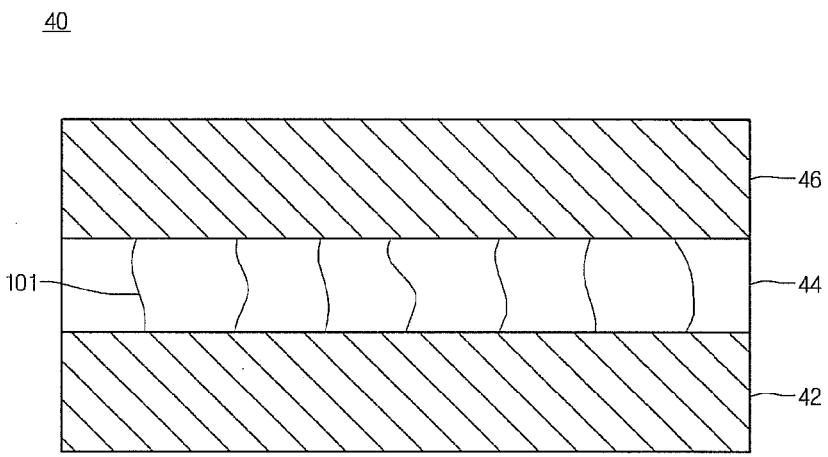
FIG. 2 is a sectional view illustrating an electrode of FIG. 1.

As shown in FIG. 2, the electrode 40 may include an adhesive layer 42, a barrier layer 44, and a bonding layer 46.

The adhesive layer 42 may be formed by a metallic material having superior adhesion strength with the light emitting structure 20, but the embodiment is not limited thereto.

The adhesive layer 42 may include a material having superior adhesion strength and superior electric conductivity or reflectivity, but the embodiment is not limited thereto.

For example, the adhesive layer 42 includes at least one or an alloy with at least two selected from the group consisting of Al, Ag, Cr, NiO, Ti, Ni, Rh, Pd, Ir, Ru, Mg, Zn, Pt, Au, and Hf, but the embodiment is not limited thereto.

The bonding layer 46 may be formed by a metallic material having superior bonding strength with respect to a wire, but the embodiment is not limited thereto.

The bonding layer 46 may include a material with superior bonding strength or superior electric conductivity, but the embodiment is not limited thereto.

The bonding layer 46 includes at least one selected from the group consisting of Au, AuSn, Au(Ni)Sn, Au(Pt)Sn, and NiSn.

The barrier layer 44 may be disposed between the adhesive layer 42 and the bonding layer 46 to prevent diffusion between the adhesive layer 42 and the bonding layer 46.

When a material of the adhesive layer 42 is diffused into the bonding layer 46 or a material of the bonding layer 46 is diffused into the adhesive layer 42, the adhesion strength of the adhesive layer 42 or the bonding strength of the bonding layer 46 is degraded so that the reliability of the light emitting device may be deteriorated. In order to solve the above problem, a barrier layer 44 may be disposed between the adhesive layer 42 and the bonding layer 46.

The barrier layer 44 may have a very thin thickness in the range of about 80 nm to 120 nm. That is, a thickness of the barrier layer 44 may be less than a thickness of the adhesive layer 42 or the bonding layer 46, but the embodiment is not limited thereto. For instance, the thickness of the adhesive layer 42 may be substantially the same as or slightly greater than that of the barrier layer 44, but the embodiment is not limited thereto. For example, the thickness of the bonding layer 46 is three times to ten times greater than a thickness of the barrier layer 44, but the embodiment is not limited thereto.

The barrier layer 44 may include one, an alloy with at least two, or a stack layer of at least two selected from the group consisting of Ni, TiW, Rh, Pt, Al, and TiAl, but the embodiment is not limited thereto.

Figure 3:
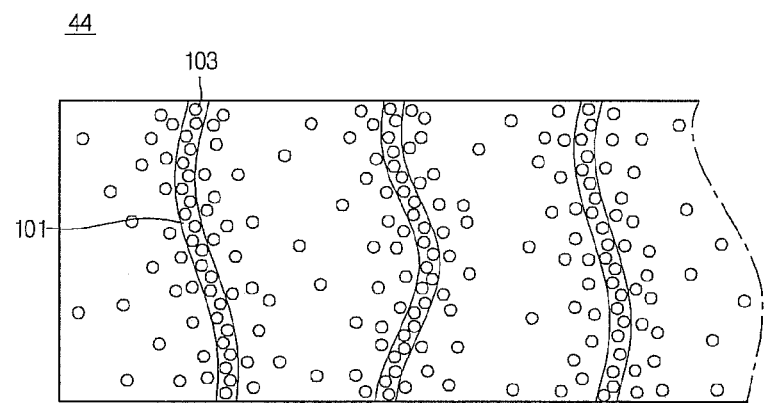
FIG. 3 is a sectional view illustrating a barrier layer in the electrode shown in FIG. 1.
Figure 4:
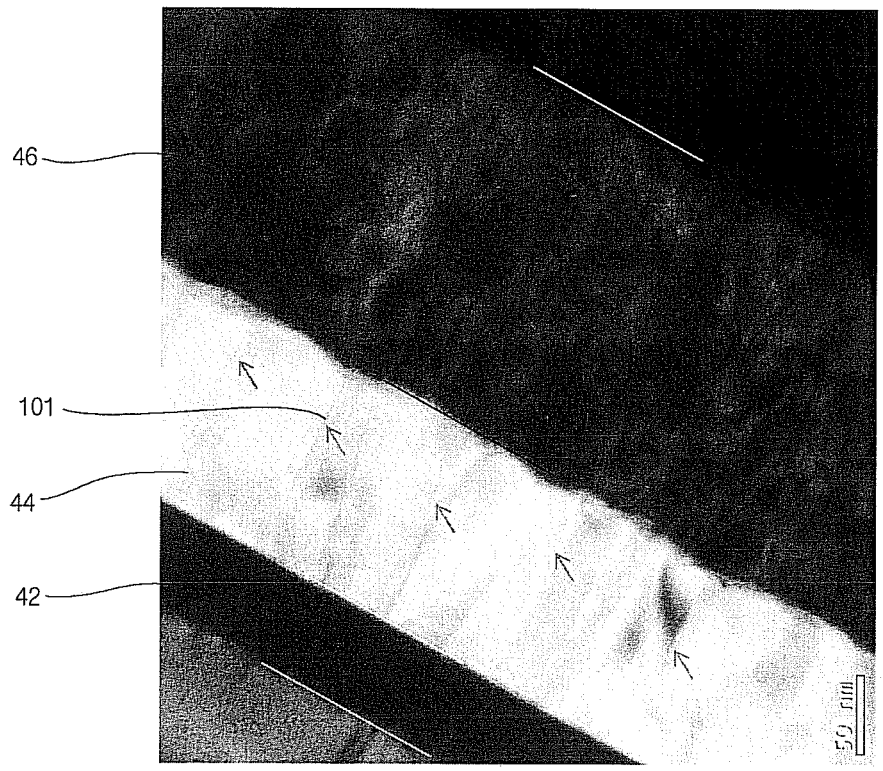
FIG. 4 is an image illustrating a grain boundary (hereinafter, referred to as 'GB') formed on the barrier layer.

As shown in FIGS. 3 and 4, a plurality of GBs (GB: grain boundary) 101 may be formed on the barrier layer 44.

The following is a description of the GB. When a molten metal is solidified so that a crystal is grown, if adjacent crystal growth surfaces make contact with each other, a boundary surface is formed at the contact position. The boundary surface is configured as a strip or a line and called a boundary line, that is, a GB. Since a periphery of the boundary surface is lately solidified, eutectic materials or impurities with low melting point are collected. Accordingly, the GB is easily corroded than other parts and is marked with a black line when observed through a microscope.

Accordingly, the GB 101 of the barrier layer 44 may be formed perpendicularly to a surface of the adhesive layer 42. Since the eutectic materials or impurities are easily collected in the GB 101 or the GB 101 is easily corroded, the adhesive layer 42 and the bonding layer 46 may be diffused through the GB 101. Such diffusion may become severe as the temperature is increased.

A deposition process to form the adhesive layer 42, the barrier layer 44, and the bonding layer 46 or a heat treatment process which is a post process to stabilize crystals of the adhesive layer 42, the barrier layer 44, and the bonding layer 46 may be performed under the temperature of several hundred Celsius degrees.

Accordingly, when the deposition process or the heat treatment process is performed at the high temperature, a material of the adhesive layer 42 may be diffused into the bonding layer 46 or a material of the bonding layer 46 may be easily diffused into the bonding layer 46 through the GB 101 of the barrier layer 44.

Although the eutectic materials or impurities are formed in the GB 101, eutectic materials or impurities cannot block diffusion of the adhesive layer 42 or the bonding layer 46.

Since the adhesive layer 42 and the bonding layer 46 lose their functions due to the diffusion so that the adhesion strength of the adhesive layer 42 and the bonding strength of the bonding layer 46 are degraded, the electrode 40 may not easily adhere to the light emitting structure 20 or a wire may not be bonded to the electrode 40, thereby significantly reducing the reliability of the light emitting device.

In the light emitting device according to the embodiment, an interstitial element 103 is distributed in the GB 101 of the barrier layer 44 so that the diffusion between adjacent layers, for example, the diffusion between the adhesive layer 42 and the bonding layer 46 may be blocked.

The interstitial elements 103 may be dispersed and distributed or filled in the GB 101. The eutectic materials or impurities essentially existing in the GB 101 may be formed between the interstitial elements 103 in the GB 101.

The interstitial elements 103 may be distributed in the barrier layer 44 as well as in the GB 101. The interstitial elements 103 are mainly distributed in the GB 101, and a distribution density of interstitial elements 103 is gradually reduced as the interstitial elements 103 are located away from the GB 101. That is, the distribution density of interstitial elements 103 is gradually increased as the interstitial elements 103 are close to the GB 101 in the barrier layer 44 and the interstitial elements 103 have the highest distribution density in the GB 101.

The interstitial element 103 may be entirely or partially distributed in the GB 101, but the embodiment is not limited thereto.

The barrier layer 44 may include a plurality of GBs 101. The interstitial element 103 may occupy at least 30% based on the entire area of the GBs 101 or at least 50% based on the area of each GB 101, but the embodiment is not limited thereto.

That is, at least 30% or at least 50% may be a least condition to block the diffusion of the adhesive layer 42 and the bonding layer 46 by the distribution of the interstitial element 103. When the interstitial element 103 occupies at least 30% based on the entire area of the GBs 101 or at least 50% based on the area of each GB 101, the diffusion of the adhesive layer 42 and the bonding layer 46 may be completely blocked.

The interstitial element 103 may include at least one selected from the group consisting of C, O, N, F, and B, but the embodiment is not limited thereto.

The barrier layer 44 may be formed by an ion implantation process or a co-doping process.

For example, a material for the barrier layer 44 includes at least one and an alloy or a stack layer with at least two selected from the group consisting of Ni, TiW, Rh, Pt, Al, and TiAl, but the embodiment is not limited thereto. Next, the interstitial element 103, that is, at least one selected from the group consisting of O, N, F, and B may be distributed in a plurality of GBs 101 formed on the barrier layer 44 as well as the barrier layer 440 by injecting interstitial element 103 into the barrier layer 44 through the ion implantation process. The interstitial element 103 may be distributed in the GB 101 corresponding to a top surface of the barrier layer 44 because of characteristics of the ion implantation process. However, when a thickness of the barrier layer 44 is the same as or slightly greater than a skin depth in the ion implantation process, the interstitial element 103 may be distributed in the whole region in the GB 101 regardless of upper and lower parts of the barrier layer 44.

The GB 101 may be formed from a top surface of the adhesive layer 41 to a rear surface of the bonding layer 46 through the barrier layer 44, but the embodiment is not limited thereto. That is, the GB 101 may be vertically formed through the barrier layer 44.

Figure 5:
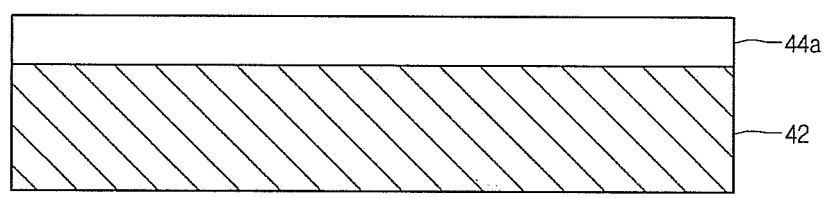
FIGS. 5 to 7 are views illustrating a process to form the barrier layer.
Figure 6:
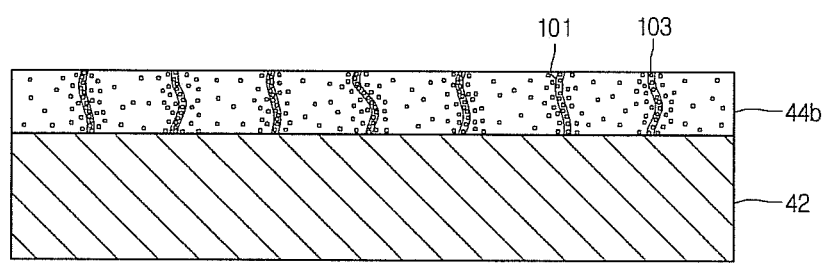
Figure 7:
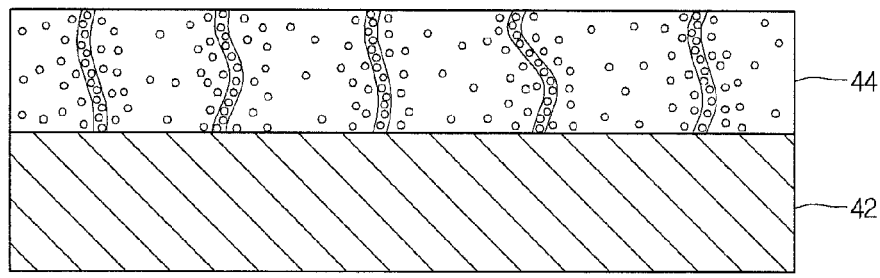

FIGS. 5 to 7 are views illustrating a process to form the barrier layer.

Although the following description has been made based on the co-doping process, the ion implantation process is also possible as described above.

Referring to FIG. 5, a barrier layer 44a may be firstly formed on the adhesive layer 42 using the co-doping process by mixing a material for the barrier and an interstitial element 103.

When the barrier layer 44a is firstly formed so that a thickness of the barrier layer 44a is thin, the GB 101 may not be formed.

Referring to FIG. 6, when the barrier layer 44a is continuously formed using the co-doping process so that the thickness of the barrier layer 44b becomes thick, the GB 101 may be formed. The interstitial element 103 may be distributed around the GB 101 as well as in the GB 101 formed as described above.

Referring to FIG. 7, a barrier layer 44 where the interstitial element 103 is distributed in the GB 101 may be formed by continuously forming the barrier layer 44b with a preset thickness through the co-doping process.

Figure 8:
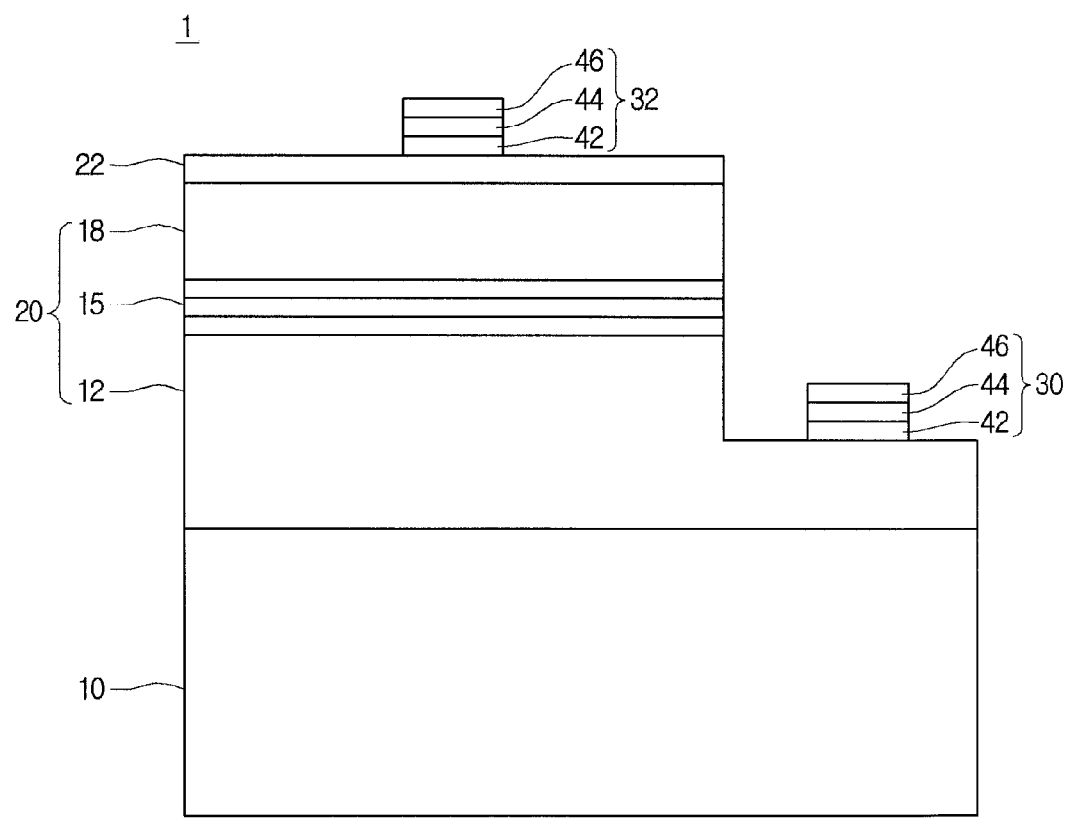
FIG. 8 is a sectional view illustrating a lateral-type light emitting device according to a first embodiment.

FIG. 8 is a sectional view illustrating a lateral-type light emitting device according to a first embodiment.

Referring to FIG. 8, the horizontal-type light emitting device 1 according to the first embodiment may include a substrate 10, a light emitting structure 20, a transparent conductive layer 22, a first electrode 30, and a second electrode 32, but is not limited thereto.

The light emitting structure 20 may include a first conductive semiconductor layer 12, an active layer 15, and a second conductive semiconductor 1, but the embodiment is not limited thereto.

The first and second electrodes 30 and 32 may have the same structure and same function as those of the electrode 40 shown in FIG. 1. Therefore, a detailed description of the first and second electrodes 30 and 32 will be omitted, and the omitted contents will be easily understood from the above description.

Each of the first and second electrodes 30 and 32 may include an adhesive layer, a barrier layer, and a bonding layer.

The adhesive layer of the first electrode 30 may be formed on the first conductive semiconductor layer 12, and the adhesive layer of the second electrode 32 may be formed on the transparent conductive layer 22.

The barrier layer may include a plurality of GBs, and at least an interstitial element may be scattered in the GBs.

Diffusion between the adhesive layer and the bonding layer is blocked due to the interstitial element distributed in the GBs so that intrinsic functions of the adhesive layer and the bonding layer can be maintained, thereby improving the reliability of the lateral-type light emitting device 1.

The interstitial element may include at least one selected from the group consisting of C, O, N, F, and B, but the embodiment is not limited thereto.

The interstitial elements may be dispersed and distributed or filled in the GB. The eutectic materials or impurities essentially existing in the GB may be formed between the interstitial elements in the GB.

The interstitial elements may be distributed in the barrier layer as well as in the GB. That is, the distribution density of interstitial elements is gradually increased as the interstitial elements are close to the GB in the barrier layer and the interstitial elements have the highest distribution density in the GB.

The interstitial element may be entirely or partially distributed in the GB, but the embodiment is not limited thereto.

The barrier layer may include a plurality of GBs. The interstitial element 103 may occupy at least 30% based on the entire area of the GBs 101 or at least 50% based on the area of each GB 101, but the embodiment is not limited thereto.

The lateral-type light emitting device 1 according to the first embodiment may further include a buffer layer disposed between the substrate 10 and the light emitting structure 20.

The lateral-type light emitting device 1 according to the first embodiment may further include another semiconductor layer (not shown) disposed below and/or above the light emitting structure 20.

The lateral-type light emitting device 1 according to the first embodiment may further include an undoped semiconductor layer (not shown) disposed between the buffer layer and the light emitting structure 20.

The substrate 10 serves to easily grow the light emitting structure 20, but the embodiment is not limited thereto.

In order to stably grow the light emitting structure 20, the substrate 10 may be formed by a material having a lattice constant similar to that of the light emitting structure 20.

The substrate 10 may be formed by at least one selected from the group consisting of sapphire ($Al_2O_3$), SiC, Si, GaAs, GaN, ZnO, Si, GaP, InP, and Ge.

The buffer layer may be disposed between the substrate 10 and the light emitting structure 20. The buffer layer may be formed to reduce a lattice constant difference between the substrate 10 and the light emitting structure 20.

Each of the buffer layer and the light emitting structure 20 may include a compound semiconductor material of group II to VI.

The light emitting structure 20 may be formed on one of the substrate 10, the buffer layer, and the undoped semiconductor layer.

For example, the light emitting structure 20 may include a first conductive semiconductor layer 12, an active layer 15, and a second conductor layer 18. The first conductive semiconductor layer 12 is formed on one of the substrate 10, the buffer layer, and an undoped semiconductor layer, the active layer 15 is formed on the first conductive semiconductor layer 12, and the second conductive semiconductor layer 18 may be formed on the active layer 15.

The first conductive semiconductor layer 12 may include an N type semiconductor layer. The first conductive semiconductor layer 12 may include a semiconductor material having a compositional formula of $In_xAl_yGa_{1-x-y}N$ ($0 \leq x \leq 1$, $0 \leq y \leq 1$, and $0 \leq x+y \leq 1$). For example, the first conductive semiconductor layer 12 may include one selected from the group consisting of InAlGaN, GaN, AlGaN, AlInN, InGaN, AlN, and InN, and may be doped with N type dopants such as Si, Ge, and Sn.

The active layer 15 may be formed on the first conductive semiconductor layer 12.

A first carrier, for example, electrons injected through the first conductive semiconductor layer 12 may be recombined with a second carrier, for example, holes injected through the second conductive semiconductor layer 18 at the active layer 15, so that the active layer 15 emits the light based on the band gap difference of the energy band according to the intrinsic material of the active layer 15.

The active layer 15 may have one of a multiple quantum well (MQW) structure, a quantum dot structure, and a quantum wire structure, but the embodiment is not limited thereto. The active layer 15 may have a stack structure including a well layer and a barrier layer, which are made from group II to VI compound semiconductor material.

For instance, the active layer 15 may have a stack structure of InGaN well/GaN barrier layers or AlGaN well/GaN barrier layers. A band gap of the barrier layer may be larger than a band gap of the well layer.

The second conductive semiconductor layer 18 may be formed on the active layer 15. The second conductive semiconductor layer 18 may include a P type semiconductor layer with a P type dopant. The P type conductive semiconductor layer may include a semiconductor material having a compositional formula of $In_xAl_yGa_{1-x-y}N$ ($0 \leq x \leq 1$, $0 \leq y \leq 1$, and $0 \leq x+y \leq 1$). For example, the P type conductive semiconductor layer may include one selected from the group consisting of InAlGaN, GaN, AlGaN, InGaN, AlN, InN, and AlInN and may be doped with P type dopants such as Mg, Zn, Ca, Sr, and Ba.

A transparent conductive layer 22 may be formed on the second conductive semiconductor layer 18, and a second electrode 32 may be formed on a partial region of the transparent conductive layer 22.

A first electrode 30 may be formed on a partial region of the first conductive layer 12 of the light emitting structure 20. To this end, the second conductive semiconductor layer 18 and the active layer 15 are removed and a partial top surface of the first conductive semiconductor layer 12 may be removed by a mesa etching. The first electrode 30 may be formed the first conductive semiconductor layer 12 which is removed.

Since the second electrode 32 may be disposed at the uppermost portion of the lateral-type light emitting device 1 and the first electrode 30 may be formed at a side of the lateral-type light emitting device 1, if power is applied to the first and second electrodes 30 and 32, a current flows to the light emitting structure 20 corresponding to the shortest path between the first and second electrodes 30 and 32 so that light may not be emitted from the whole region of the active layer 15 of the light emitting structure 20.

Accordingly, the transparent conductive layer 22 may be formed on the entire area of the second conductive semiconductor layer 18 between the second conductive semiconductor layer 18 and the second electrode 32 so that a current spreads to the whole region of the transparent conductive layer 22 through the second electrode 32. Thus, the current flows between the first electrode 30 and the whole region of the transparent conductive layer 22 so that the light is emitted from the whole region of the active layer 15 of the light emitting structure 20, thereby improving light emitting efficiency.

The transparent conductive layer 22 may include a conductive material with superior transmission to transmit light and electric conductivity. For example, the transparent conductive layer 22 may include at least one selected from the group consisting of ITO, IZO(In—ZnO), GZO(Ga—ZnO), AZO (Al—ZnO), AGZO(Al—Ga ZnO), IGZO(In—Ga ZnO), IrOx, RuOx, RuOx/ITO, Ni/IrOx/Au, and Ni/IrOx/Au/ITO.

Figure 9:
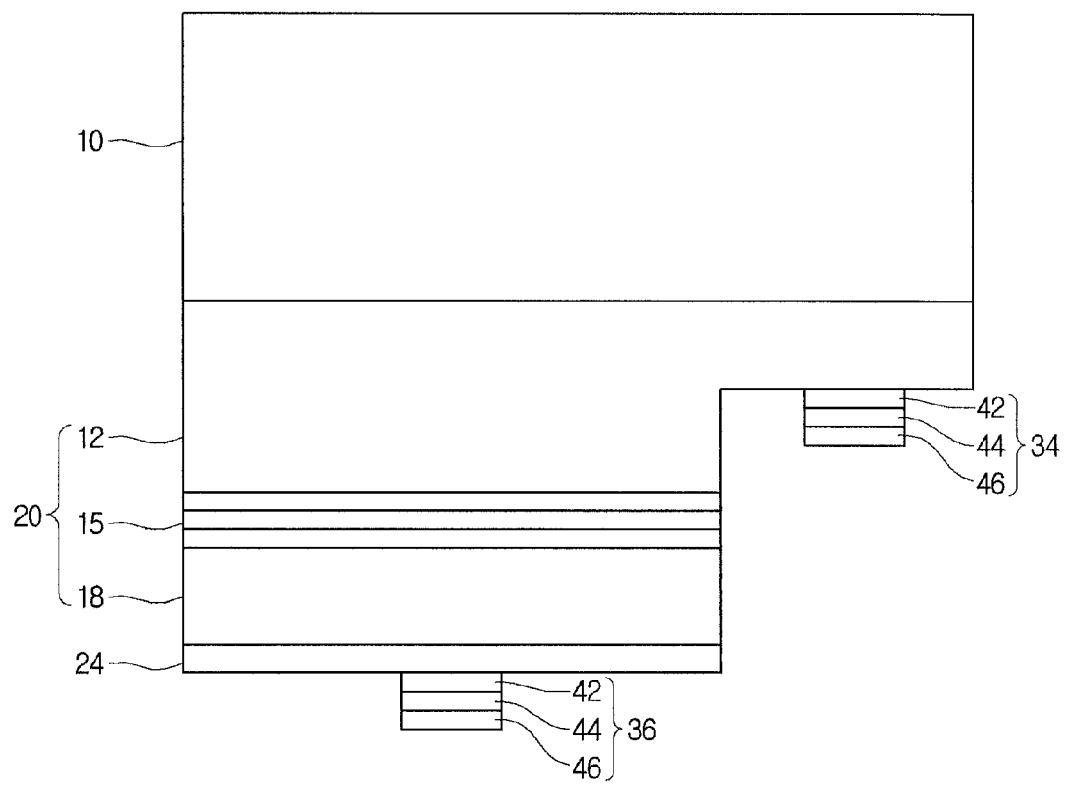
FIG. 9 is a sectional view illustrating a flip-type light emitting device according to a second embodiment.

FIG. 9 is a sectional view illustrating a flip-type light emitting device according to a second embodiment.

The second embodiment is similar to the first embodiment except that a reflective layer 24 may be formed instead of the transparent conductive layer 22 of the first embodiment. In the following description of the second embodiment, the constituent elements having the same shape and functions as those of the first embodiment will be assigned with the same reference numerals and a detailed description thereof will be omitted.

Referring to FIG. 9, a flip-type light emitting device 1A may include a substrate 10, a light emitting structure 20, a reflective layer 24, a first electrode 34, and a second electrode 36, but the embodiment is not limited thereto.

The light emitting structure 20 may include a first conductive semiconductor layer 12, an active layer 15, and a second conductive semiconductor layer 18.

The first conductive semiconductor layer 12 may be formed under the substrate 10, an active layer 15 may be formed under the first conductive semiconductor layer 12, and the second conductive semiconductor layer 18 may be formed under the active layer 15.

A reflective layer 24 may be formed under of the second conductive semiconductor layer.

A first electrode 34 may be formed under the first conductive semiconductor layer 12, and a second electrode 36 may be formed under the reflective layer 24.

The first and second electrodes 34 and 36 may have a structure and a shape substantially identical to those of the first and second electrodes 30 and 32 of the first embodiment.

Each of the first and second electrodes 34 and 36 may include an adhesive layer, a barrier layer, and a bonding layer.

The adhesive layer of the first electrode 34 may be formed under the first conductive semiconductor layer 12, and the adhesive layer of the second electrode may be formed under the reflective layer 24.

The barrier layer may include a plurality of GBs, and at least an interstitial element may be scattered into the GBs.

The diffusion between the adhesive layer and the bonding layer is blocked according to the interstitial element scattered into the GBs so that original functions of the adhesive layer and the bonding layer maintain, thereby improving the reliability of the lateral-type light emitting device 1A.

The interstitial element may include at least one selected from the group consisting of C, O, N, F, and B, but the embodiment is not limited thereto.

The interstitial elements may be dispersed and distributed or filled in the GB. The eutectic materials or impurities essentially existing in the GB may be formed between the interstitial elements in the GB.

The interstitial elements may be distributed in the barrier layer as well as in the GB. That is, the distribution density of interstitial elements is gradually increased as the interstitial elements are close to the GB in the barrier layer and the interstitial elements have the highest distribution density in the GB.

The interstitial element may be entirely or partially distributed in the GB, but the embodiment is not limited thereto.

The barrier layer may include a plurality of GBs. The interstitial element may occupy at least 30% based on the entire area of the GBs 101 or at least 50% based on the area of each GB 101, but the embodiment is not limited thereto.

The reflective layer 24 reflects light generated from the active layer 15, and may be formed by a reflective material having a high reflectivity. For example, the reflective material includes may include at least one or an alloy with at least two selected from the group consisting of Ag, Ni, Al, Rh, Pd, Ir, Ru, Mg, Zn, Pt, Au and Hf, but the embodiment is not limited thereto.

The light generated from the active layer 15 is reflected by the reflective layer 24 so that the reflected light may be output to the outside through the substrate.

Figure 10:
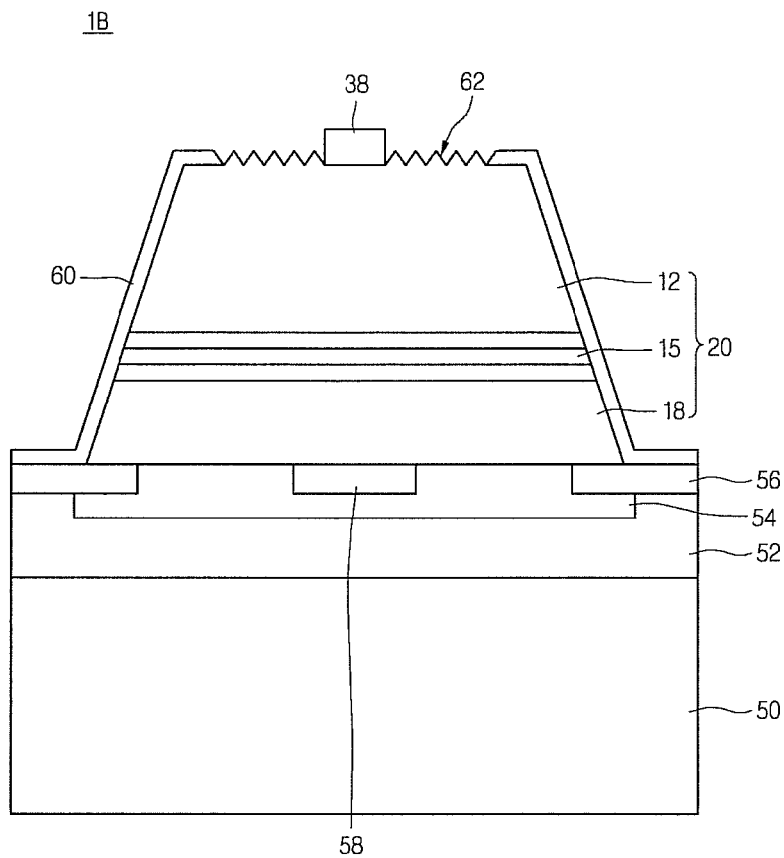
FIG. 10 is a sectional view illustrating a vertical-type light emitting device according to a third embodiment.

FIG. 10 is a sectional view illustrating a vertical-type light emitting device according to a third embodiment.

Instead of the first and second electrodes 30 and 32 of the first embodiment or the first and second electrodes 34 and 36 of the second embodiment, the third embodiment may include an electrode 38 and an electrode layer 54, and the electrode 38 and the electrode layer 54 are vertically overlapped with each other. In addition, since the electrode layer 54 may have a size larger than that of an active layer 15 of the light emitting structure 20 and has a reflective property in the third embodiment, the light generated from the active layer 15 is reflected in a forward direction so that a light emitting efficiency can be improved.

The first and second electrodes 30 and 32 of the first embodiment, the first and second electrodes 34 and 36 of the second embodiment, and the electrode 38 of the third embodiment may have the same structure and same functions as those of the electrode 40 shown in FIG. 1. Accordingly, a detailed description of the electrode 38 according to the third embodiment is omitted, and the omitted contents will be easily understood from the above description.

Referring to FIG. 10, the light emitting device 1B according to the third embodiment may include a support substrate 50, an adhesive layer 52, an electrode layer 54, a channel layer 56, a current blocking layer (CBL) 58, a light emitting structure 20, a protective layer 60, and an electrode 38.

The support substrate 50, the adhesive layer 52, and the electrode layer 54 may constitute an electrode member to supply power.

The support substrate 50 may support a plurality of layers formed thereon and may serve as an electrode. The support substrate 50 may supply power to the light emitting structure 20 together with the electrode 38.

The support substrate 50 may include a metallic material or a semiconductor material, but the embodiment is not limited thereto. The support substrate 50 may include a material representing high electrical conductivity and thermal conductivity. For example, the support substrate 50 may include a metallic material with at least one selected from the group consisting of Ti, Cr, Ni, Al, Pt, Au, W, Cu, a Cu Alloy, Mo, and Cu—W. For instance, the support substrate 50 may include a semiconductor material with at least one selected from the group consisting of Si, Ge, GaAs, GaN, ZnO, SiGe, and SiC.

The support substrate 50 may be plated and/or deposited under the light emitting structure 20, or may attached in the of a sheet under the light emitting structure 20, but the embodiment is not limited thereto.

The support substrate 50 may be formed thereon with the adhesive layer 52. The adhesive layer 52 is disposed between the electrode layer 54 and the support substrate 50. The adhesive layer 52 may serve as a medium to enhance the adhesive strength between the electrode layer 54 and the support substrate 50.

The adhesive layer 52 may include barrier metal or bonding metal. The adhesive layer 52 may include a metallic material representing a higher adhesive property and higher thermal conductivity. The adhesive layer 13 may include at least one selected from the group consisting of Ti, Au, Sn, Ni, Nb, Cr, Ga, In, Bi, Cu, Ag and Ta.

The adhesive layer 52 may be formed thereon with a barrier layer that is not shown. The barrier layer may prevent materials constituting the adhesive layer 52 and the support substrate 50 formed under the barrier layer from being spread to the electrode layer 54 or the light emitting structure 20 faulted on the barrier layer to degrade the characteristic of the vertical-type light emitting device 1B.

The barrier layer may include a single layer including a material selected from the group consisting of Ni, Pt, Ti, W, V, Fe and Mo or a stack layer of at least two materials described above.

The barrier layer may make contact with a bottom surface of the electrode layer 54.

A top surface of the adhesive layer 52 may include a groove in which a peripheral region of the groove extends upward, that is, toward the light emitting structure 20 as compared with a central region of the groove, but the embodiment is not limited thereto. The electrode layer 54 may make contact with a central region of a top surface of the adhesive layer 52 or may be formed in the groove, but the embodiment is not limited thereto.

Although not shown in the drawing, both of a central region and a peripheral region of the top surface of the adhesive layer 52 may be aligned in the same line with each other.

That is, the whole region of the top surface of the adhesive layer 52 may have a flat surface. In this case, the electrode layer 54 may be formed on a central region of the top surface of the adhesive layer 52 or the whole region of the top surface of the adhesive layer 52.

That is, the size of the electrode layer 54 may be smaller than or the same as the size of the adhesive layer 52.

The top surface of the electrode layer 54 may be aligned on the same line with the top surface of the channel layer 56.

A bottom surface of the electrode layer 54 and a bottom surface of the channel layer 56 may be aligned at different positions, respectively. That is, since the electrode layer 54 is formed on the central region of the adhesive layer 52 in which the groove of the adhesive layer 52 and the channel layer 56 is formed on the peripheral region of the adhesive layer 52, the bottom surface of the electrode layer 54 may be formed at a position lower than the bottom surface of the channel layer 56.

A partial region of the electrode layer 54 may be vertically overlapped with a bottom surface of the channel layer 56. That is, an inner region of the channel layer 56 may extend to an inner side through an end of the electrode layer 54.

The electrode layer 54 may reflect light incident thereto from the light emitting structure 20 to improve light extraction efficiency.

The electrode layer 54 may make ohmic contact with the light emitting structure 20, so that current may flow through the light emitting structure 20.

Although not shown, the electrode layer 54 may include a reflective layer making contact with a top surface of the adhesive layer 52 and an ohmic contact layer formed between the top surface of the reflective layer and a bottom surface of the light emitting structure 20.

The electrode layer 54 may include a single layer including the mixture of the reflective material and the ohmic contact material. In this case, it is not necessary to separately form a reflective layer and an ohmic contact layer in the electrode layer 54.

For instance, the reflective material may include at least one selected from the group consisting of Ag, Ni, Al, Rh, Pd, Ir, Ru, Mg, Zn, Pt, Au and Hf or the alloys of at least two materials described above, but the embodiment is not limited thereto. For example, the ohmic contact material may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO.

For example, the electrode layer 54 may include multiple layers including one of IZO/Ni, AZO/Ag, IZO/Ag/Ni, and AZO/Ag/Ni.

The electrode layer 54 may make ohmic contact with at least the light emitting structure 20. Accordingly, current may be smoothly supplied to the light emitting structure 20 making ohmic contact with the electrode layer 54, so that the light emission efficiency can be improved.

The electrode layer 54 may overlap with the bottom surfaces of the light emitting structure 20, a current blocking layer 58, and the channel layer 56. In order to totally reflect the light transmitted from the light emitting structure 20, the electrode layer 54 may have an area greater than that of the light emitting structure 20, especially, an active layer 15.

The electrode layer 54 may be formed thereon with the current blocking layer 58. The current blocking layer 58 may make contact with the bottom surface of the light emitting structure 20. The current blocking layer 58 may overlap with at least a portion of the electrode 38 in a vertical direction.

The current blocking layer 58 may be formed on a top surface of the electrode layer 54, but the embodiment is not limited thereto. That is, although not shown, the current blocking layer 58 may be formed on a bottom surface of the light emitting structure 20, a bottom surface of the electrode layer 54, or a top surface of the adhesive layer 52.

The current blocking layer 58 may make schottky contact with the light emitting structure 20. Accordingly, current is not smoothly supplied to the light emitting structure 20 making schottky contact with the current blocking layer 58.

Generally, current concentratedly flows along the shortest path between the support substrate 50 and the electrode 38. In order to prevent the current from concentratedly flowing, the current blocking layer 58 may be formed by allowing the electrode 38 to spatially overlap with a portion of the electrode 38. Current may not fully flow through the current blocking layer 58 or may more slightly flow through the current blocking layer 58 as compared with the electrode layer 54. On the contrary, since current smoothly flows through the electrode layer 54 making contact with the bottom surface of the light emitting structure 20, the current uniformly flows throughout the whole region of the electrode layer 54, so that the light emission efficiency can be improved.

The current blocking layer 58 may include a material representing electrical conductivity less than that of the electrode layer 54, representing an electrical insulating property less than that of the electrode layer 54, and making schottky contact with the light emitting structure 20. For instance, the current blocking layer 58 may include at least one selected from the group consisting of ITO, IZO, IZTO, IAZO, IGZO, IGTO, AZO, ATO, ZnO, $SiO_2$, SiOx, SiOxNy, $Si_3N_4$, $Al_2O_3$, TiOx, Ti, Al and Cr. In this case, the $SiO_2$, SiOx, SiOxNy, $Si_3N_4$, and Al2O3 may be insulating materials.

The electrode layer 54 may be formed thereon with the channel layer 56. For instance, the channel layer 56 may be formed along an edge region of the electrode layer 54. In other words, the channel layer 56 may be formed at a peripheral region disposed between the light emitting structure 20 and the electrode layer 54. In detail, at least a part of the channel layer 56 may surround the electrode layer 54 and the light emitting structure 20. For example, a portion of the top surface of the channel layer 56 may partially make contact with the second conductive semiconductor layer 18, and an inner lateral side and the bottom surface of the channel layer 56 may partially make contact with the electrode layer 54, but the embodiment is not limited thereto. Other regions of the bottom surface of the channel layer 56 may make contact with a peripheral region of the top surface of the adhesive layer 52.

The channel layer 56 may prevent the lateral side of the adhesive layer 52 from being electrically shorted with respect to the lateral side of the light emitting structure 20 due to external foreign matters. If the electrode layer 54 is formed on the whole region of the adhesive layer 52 so that an outer side of the electrode layer 54 is exposed to the outside, the channel layer 56 may prevent electric short between the lateral side of the electrode layer 54 and the lateral side of the light emitting structure 20.

The contact area between the channel layer 56 and the light emitting structure 20 is ensured, so that the first protective layer 23 can effectively prevent the light emitting structure 20 from being laminated from the electrode layer 54 upon a laser scribing process to divide a plurality of chips into individual chips and a laser lift off (LLO) process to remove a substrate.

When the light emitting structure 20 is over-etched in a chip division process, the electrode layer 54 may be exposed. In this case, electrical short may occur at the lateral sides of the electrode layer 54 and the active layer 15 of the light emitting structure 20 due to the foreign matters. The channel layer 56 may prevent the electrode layer 54 from being exposed due to the over-etching of the light emitting structure 20 in the chip division process.

For example, the channel layer 56 may include at least one selected from the group consisting of $SiO_2$, SiOx, SiOxNy, $Si_3N_4$, and $Al_2O_3$. In addition, the channel layer 56 may include a metallic material, but the embodiment is not limited thereto.

The channel layer 56 may include a material the same as a material constituting the current blocking layer 58, or different from that of the current blocking layer 58, but the embodiment is not limited thereto. That is, the channel layer 56 and the current blocking layer 58 may include an insulating material.

When the channel layer 56 may include a material the same as a material constituting the current blocking layer 58, the channel layer 56 and the current blocking layer 58 may be simultaneously formed through the same process. In this case, the channel layer 56 and the current blocking layer 58 may have the same thickness, but the embodiment is not limited thereto.

When the channel layer 56 includes a material different from that of the current blocking layer 58, the channel layer 56 may be formed separately from the current blocking layer 58 through processes different from each other. In this case, the channel layer 56 may have the thickness different from that of the current blocking layer 58. The current blocking layer 58 may have the thickness smaller than that of the channel layer 56, but the embodiment is not limited thereto.

The light emitting structure 20 may be formed on the electrode layer 54, the channel layer 56, and the current blocking layer 58.

The lateral side of the light emitting structure 20 may be perpendicularly formed or inclined through the etching scheme to divide a plurality of chips into individual chips. For instance, the lateral side of the light emitting structure 20 may be formed through an isolation etching scheme.

The light emitting structure 20 may include a plurality of group II to VI compound semiconductor materials.

The light emitting structure 20 may include the second conductive semiconductor layer 18, the active layer 15 on the second conductive semiconductor layer 18, and a first conductive semiconductor layer 12 on the active layer 15.

In this case, a bottom surface of the second conductive semiconductor layer 18 may make contact with a top surface of the current blocking layer 58, a top surface of the electrode layer 54, and a top surface of the channel layer 56, but the embodiment is not limited thereto.

In addition, so at to totally reflect the light generated from the active layer 15, the size of the active layer 15 may be smaller than the size of the electrode layer 54.

The channel layer 56 may include a first channel region vertically overlapped with the second conductive semiconductor layer 18 and a second channel region which is not overlapped with the second conductive semiconductor layer 18.

The first channel region may extend from an end of the second conductive semiconductor layer 18 to an inner lateral side thereof to be vertically overlapped with the first conductive semiconductor layer 12.

The second channel region may extend outward from the first channel region to an end of the adhesive layer 52.

The current blocking layer 58 may be spaced apart from the channel layer 56, and the electrode layer 54 formed between the current blocking layer 58 and the channel layer 56 may make contact with the second conductive semiconductor layer 18.

The second conductive semiconductor layer 18 may be formed on the electrode layer 54, the channel layer 56, and the current blocking layer 58. The second conductive semiconductor layer 18 may include a P type semiconductor layer with a p type dopant. The second conductive semiconductor layer 18 may include a group II to VI compound semiconductor material. For example, the second conductive semiconductor layer 18 may include one selected from the group consisting of GaN, AN, AlGaN, InGaN, InN, InAlGaN, AlInN, AlGaAs, GaP, GaAs, GaAsP, and AlGaInP. The P type dopant may include Mg, Zn, Ga, Sr, and Ba. The first conductive semiconductor layer 12 may include a layer structure or a multiple layer structure, but the embodiment is not limited thereto.

The second conductive semiconductor layer 18 serves to supply a plurality of carriers, for example, holes to the active layer 15.

The active layer 15 is formed on the second conductive semiconductor layer 18. The active layer 55 may have one of a single quantum well structure, a multiple quantum well (MQW) structure, a quantum dot structure, and a quantum wire structure, but the embodiment is not limited thereto.

The active layer 15 may be formed at the periodicity of a well layer and a barrier layer using a group II to VI compound semiconductor material. The compound semiconductor material constituting the active layer 15 may include GaN, InGaN, or AlGaN. Accordingly, for instance, the active layer 15 may have the periodicity of InGaN/GaN, InGaN/AlGaN, or InGaN/InGaN, but the embodiment is not limited thereto.

The active layer 15 may generate light having a wavelength corresponding to the energy bandgap determined by the semiconductor material of the active layer 15 through the recombination of holes, which are supplied from the second conductive semiconductor layer 18, and electrons supplied from the first conductive semiconductor layer 12.

Although not shown, a conductive clad layer may be formed on and/or under the active layer 15, and may include an AlGaN-based semiconductor material. For instance, a P type clad layer including P type dopants may be disposed between the second conductive semiconductor layer 18 and the active layer 15, and an N type clad layer including N type dopants may be disposed between the active layer 15 and the first conductive semiconductor layer 12.

The conductive clad layer serves as a guide to prevent the holes and electrons supplied to the active layer 15 from being moved to the first conductive semiconductor layer 12 and the second conductive semiconductor layer 18. Accordingly, the larger quantity of holes and electrons supplied to the active layer 15 are recombined with each other due to the conductive clad layer, so that the light emission efficiency of the vertical-type light emitting device 1B can be improved.

The first conductive semiconductor layer 12 may be formed on the active layer 15. The first conductive semiconductor layer 12 may include an N type semiconductor layer including N type dopants. The first conductive semiconductor layer 12 may include a group II to VI compound semiconductor. For instance, the second conductive semiconductor layer 12 may include one selected from the group consisting of GaN, AlN, AlGaN, InGaN, InN, InAlGaN, AlInN, AlGaAs, GaP, GaAs, GaAsP and AlGaInP. The N type dopants may include Si, Ge, Sn, Se, and Te. The first conductive semiconductor layer 12 may be formed in a single layer or multiple layers, but the embodiment is not limited thereto.

When the light emitting structure 20 is grown, the light emitting structure 20 may be grown in the order of the first conductive semiconductor layer 12, the active layer 15, and the second conductive semiconductor layer 18.

The first conductive semiconductor layer 12 may be formed at the top surface thereof with a light extraction structure 62 for the purpose of improving light extraction efficiency.

The light extraction structure 62 may be a roughness structure, but the embodiment is not limited thereto.

The electrode 38 may be formed on the first conductive semiconductor layer 12.

As described above, the electrode 38 of the third embodiment may have the same structure, shape, and functions as those of the electrode 40 shown in FIG. 1.

The electrode 38 may include an adhesive layer, a barrier layer, and a bonding layer.

The barrier layer includes a plurality of GBs, and at least interstitial element may be distributed into the GBs. In the embodiment, the diffusion between the adhesive layer and the bonding layer may be prevented by distributing the interstitial element into the GB of the barrier layer, thereby improving the reliability of the device.

Diffusion between the adhesive layer and the bonding layer is blocked due to the interstitial element distributed in the GBs so that intrinsic functions of the adhesive layer and the bonding layer can be maintained, thereby improving the reliability of the lateral-type light emitting device 1B.

The interstitial element may include at least one selected from the group consisting of C, O, N, F, and B.

The interstitial elements may be dispersed and distributed or filled in the GB. The eutectic materials or impurities essentially existing in the GB may be formed between the interstitial elements in the GB.

The interstitial elements may be distributed in the barrier layer as well as in the GB. That is, the distribution density of interstitial elements is gradually increased as the interstitial elements are close to the GB in the barrier layer and the interstitial elements have the highest distribution density in the GB.

The interstitial element may be generally or partially distributed in the GB, but the embodiment is not limited thereto.

The barrier layer may include a plurality of GBs. The interstitial element may occupy at least 30% based on the entire area of the GBs or at least 50% based on the area of each GB, but the embodiment is not limited thereto.

The electrode 38 may not cover a total area of the light emitting structure 20 but may have a pattern shape locally formed on the light emitting structure 20.

Although not shown in the drawing, the electrode 38 may include at least one electrode pad, to which a wire is bonded, and a plurality of electrode lines branching to at least one side from the electrode pad to uniformly supply a current throughout the whole region of the light emitting structure.

When viewed from the top, the electrode pad may have the shape of a rectangle, a circle, an oval, or a polygon, but the embodiment is not limited thereto.

The light emitting structure 20 may be formed thereon with the protective layer 60. For instance, the protective layer 60 may be formed on at least a lateral side of the light emitting structure 20. In detail, one end of the protective layer 60 may be formed at a peripheral region of a top surface of the first conductive semiconductor layer 12, and an opposite end of the protective layer 60 may be formed on a portion of the top surface of the channel layer 56 through the lateral side of the first conductive semiconductor layer 12, the lateral side of the active layer 15, and the lateral side of the second conductive semiconductor layer 18, but the embodiment is not limited thereto.

The protective layer 60 may prevent electrical short between the light emitting structure 20 and the support substrate 51 and protect the vertical-type light emitting device 1B from external shock. The protective layer 60 may include a material representing superior transmittance and a superior insulating property. For instance, the protective layer 60 may include one selected from the group consisting of $SiO_2$, SiOx, SiOxNy, $Si_3N_4$, $TiO_2$ and $Al_2O_3$, but the embodiment is not limited thereto.

The protective layer 60 may include a material the same as materials constituting the channel layer 56 and the current blocking layer 58, but the embodiment is not limited thereto.

Figure 11:
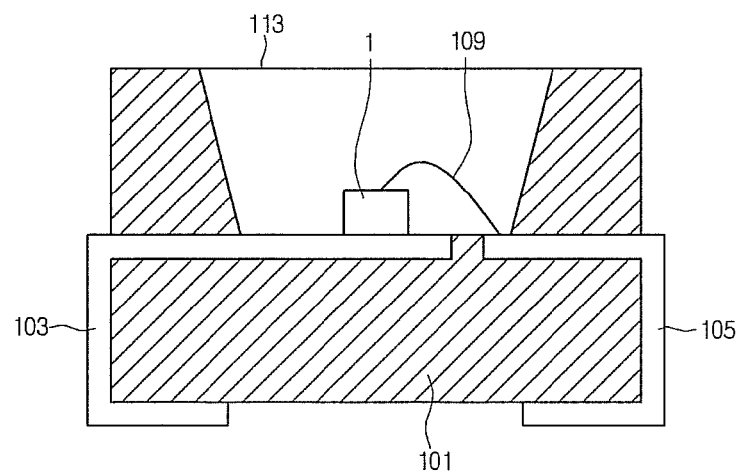
FIG. 11 is a sectional view of a light emitting device package according to the embodiment.

FIG. 11 is a sectional view of a light emitting device package according to the embodiment.

Referring to FIG. 11, a light emitting device package includes a body 101, first and second lead electrodes 103 and 105 installed in the body 101, the light emitting device 1 according to the first and second embodiments, which is installed in the body 101 to receive power from the lead electrodes 103 and 105, and a molding member 113 surrounding the light emitting device 1.

The body 101 may include a silicon material, a synthetic resin material, or a metallic material. The body 101 may have an inclined surface around the light emitting device 1.

The first lead electrode 103 and the second lead electrode 105 are electrically insulated from each other to supply power to the light emitting device 1.

Further, the first and second lead electrodes 103 and 105 may reflect light generated from the light emitting device 1 to increase light efficiency, and may discharge heat generated from the light emitting device 1 to the outside.

The light emitting device 1 may be installed at one of the first lead electrode 103, a second lead electrode 105, and the body 101, and may be electrically connected with the first and second lead electrodes 103 and 105 through a wire scheme or a die bonding scheme, but the embodiment is not limited thereto.

According to the embodiment, the light emitting device 1 is electrically connected to one of the first and second lead electrodes 103 and 105 through one wire 109, but the embodiment is not limited thereto. The light emitting device 1 may be electrically connected to the first and second lead electrodes 103 and 105 through two wires. The light emitting device 1 may be electrically to the first and second lead electrodes 103 and 105 without using the wire.

The molding member 113 may protect the light emitting device 1 by surrounding the light emitting device 1. In addition, the molding member 113 may include phosphors to change the wavelength of light emitted from the light emitting device 1.

The light emitting device package 200 according to the embodiment includes a COB (Chip On Board) type package. A top surface of the body 101 is flat, and a plurality of light emitting devices may be installed at the body 101.

The light emitting device and the light emitting device package according to the embodiment are applicable to a light unit. The light unit is applicable to a display device and a lighting device, for example, a lighting lamp, a signal lamp, a headlight of a vehicle, an electric signboard, and an indication lamp.

An embodiment provides a light emitting device which can improve reliability by preventing diffusion.

A light emitting device according to an embodiment includes: a light emitting structure including a first conductive semiconductor layer, an active layer on the first conductive semiconductor layer, and a second conductive semiconductor layer on the active layer; and an electrode disposed on at least one of the first and second conductive semiconductor layers, wherein the electrode includes: an adhesive layer disposed on the light emitting structure; a barrier layer on the adhesive layer; and a bonding layer disposed on the barrier layer, and wherein the barrier layer comprises a plurality of grain boundaries, and each of the grain boundaries comprises interstitial elements.

A light emitting device package according to an embodiment includes a body; first and second lead electrodes, a light emitting device on one of the first and second lead electrodes; and a molding member to surround the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure including a first conductive semiconductor layer, a second conductive semiconductor layer on the first conductive semiconductor layer, and an active layer therebetween, and an electrode on at least one of the first conductive semiconductor layer or the second conductive semiconductor layer, wherein the electrode comprises:
an adhesive layer on the light emitting structure;
a barrier layer on the adhesive layer; and
a bonding layer on the barrier layer, and
wherein the barrier layer includes a plurality of grain boundaries, wherein interstitial elements are distributed in the barrier layer and the grain boundaries, wherein the grain boundaries include interstitial elements and eutectic materials between the interstitial elements.

2. The light emitting device of claim 1, wherein the grain boundaries extend from a bottom surface of the barrier layer to a top surface of the barrier layer.

3. The light emitting device of claim 1, wherein the interstitial elements are distributed in the grain boundary and a region close to the grain boundary.

4. The light emitting device of claim 3, wherein a distribution density of the interstitial elements is gradually increased as the interstitial elements are close to the grain boundary.

5. The light emitting device of claim 1, wherein an area of the interstitial elements is at least 30% based on a whole area of the grain boundaries.

6. The light emitting device of claim 1, wherein an area of the interstitial elements is at least 50% based on an area of each grain boundary.

7. The light emitting device of claim 1, wherein the interstitial element comprises at least one selected from the group consisting of C, O, N, F, and B.

8. The light emitting device of claim 1, wherein the barrier layer has a thickness less than a thickness of the adhesive layer and a thickness of the bonding layer.

9. The light emitting device of claim 1, wherein the electrode comprises;
a first electrode on a partial region of a top surface of the first conductive layer; and
a second electrode on a partial region of a top surface of the second conductive layer.

10. The light emitting device of claim 9, wherein the first and the second electrodes are formed of a same number of layers.

11. The light emitting device of claim 9, further comprising a transparent conductive layer between the second conductive semiconductor layer and the second electrode.

12. The light emitting device of claim 1, wherein a density of the interstitial element distributed in each grain boundary is higher than a density of the interstitial element distributed in a region between the grain boundaries.

13. The light emitting device of claim 9, wherein the barrier layer comprises one selected from the group consisting of Ni, TiW, Rh, Pt, Al, and TiAl.

14. A light emitting device comprising:
a first semiconductor layer having N type dopants;
a second semiconductor layer having P type dopants;
an active layer between the first and second semiconductor layers; and
an electrode on a portion of a top surface of at least one of the first or second semiconductor layers,
wherein the electrode comprises:
an adhesive layer on a top surface of at least one of the first semiconductor layer or the second semiconductor layer;
a barrier layer on a top surface of the adhesive layer; and
a bonding layer on a top surface of the barrier layer,
wherein a plurality of grain boundaries are provided in the barrier layer,
wherein a density of interstitial elements distributed in the grain boundary is higher than a density of interstitial elements distributed in a region between the grain boundaries,
wherein the interstitial elements are distributed in the barrier layer and the grain boundaries, and
wherein the grain boundaries include interstitial elements and eutectic materials between the interstitial elements.

15. The light emitting device of claim 14, wherein the grain boundary extends between a bottom surface and the top surface of the barrier layer in a vertical direction.

16. The light emitting device of claim 15, wherein a distribution density of the interstitial elements is gradually reduced as the interstitial elements are located away from the grain boundary.

17. The light emitting device of claim 15, wherein the barrier layer has a thickness thinner than a thickness of the adhesive layer and a thickness of the bonding layer.

18. The light emitting device of claim 15, wherein the interstitial element comprises at least one selected from the group consisting of C, O, N, F, and B, and
the barrier layer comprises one selected from the group consisting of Ni, TiW, Rh, Pt, Al, and TiAl.

19. The light emitting device of claim 15, wherein the barrier layer has a metal different from a materials of the adhesive layer and the bonding layer.

20. The light emitting device of claim 15, wherein the interstitial element is exposed to the top surface and the bottom surface of the barrier layer.

* * * * *